United States Patent
York et al.

(10) Patent No.: US 10,935,960 B2
(45) Date of Patent: Mar. 2, 2021

(54) PRE-RUNTIME FAN CONTROL

(71) Applicant: HEWLETT PACKARD ENTERPRISE DEVELOPMENT LP, Houston, TX (US)

(72) Inventors: Justin York, Cypress, TX (US); Brian Collum, Houston, TX (US); Michael Stearns, Cypress, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 76 days.

(21) Appl. No.: 16/447,537

(22) Filed: Jun. 20, 2019

(65) Prior Publication Data
US 2020/0401112 A1   Dec. 24, 2020

(51) Int. Cl.
G05B 19/4155    (2006.01)
H05K 7/20       (2006.01)

(52) U.S. Cl.
CPC ............. *G05B 19/4155* (2013.01); *G05B 2219/37431* (2013.01); *H05K 7/20836* (2013.01)

(58) Field of Classification Search
CPC ...... G05B 19/4155; G05B 2219/37431; H05K 7/20836
See application file for complete search history.

(56) References Cited

U.S. PATENT DOCUMENTS

| | | | | |
|---|---|---|---|---|
| 7,726,144 B2* | 6/2010 | Larson | .................... | H01L 23/34 62/259.2 |
| 7,737,847 B2* | 6/2010 | Malone | .................. | G06Q 50/04 340/572.1 |
| 8,560,132 B2 | 10/2013 | Matteson | | |
| 9,420,726 B2 | 8/2016 | Kodama | | |
| 9,541,971 B2* | 1/2017 | Haridass | ................. | G06F 1/206 |
| 10,222,843 B1 | 3/2019 | Lin et al. | | |
| 2006/0181232 A1 | 8/2006 | Oljaca et al. | | |
| 2012/0131249 A1* | 5/2012 | Cepulis | ................... | G06F 1/189 710/269 |
| 2013/0166092 A1* | 6/2013 | Wang | .................. | G06F 11/3058 700/299 |
| 2017/0102747 A1 | 4/2017 | Ragupathi et al. | | |
| 2017/0315599 A1* | 11/2017 | Marripudi | .............. | G06F 1/206 |
| 2018/0267582 A1* | 9/2018 | Woo | ........................ | G05D 13/62 |
| 2019/0200489 A1* | 6/2019 | Martinez Garcia | ......................... | H05K 7/20609 |
| 2019/0239384 A1* | 8/2019 | North | ..................... | G06F 1/3206 |

OTHER PUBLICATIONS

Nishi Ahuja et al., "Real Time Monitoring and Availability of Server Airflow for Efficient Data Center Cooling," 29th IEEE SEMI-THERM Symposium, Jun. 10, 2013, pp. 243-247, IEEE.

* cited by examiner

*Primary Examiner* — Ramesh B Patel
(74) *Attorney, Agent, or Firm* — Hewlett Packard Enterprise Patent Department

(57) ABSTRACT

Examples disclosed herein relate to initializing a fan speed of a computing device using a high-water value when a pre-runtime event occurs. A management controller (MC) receives sensor data from sensors of the computing device. A fan speed of a fan is controlled using a fan control value based on the sensor data. The fan control value is monitored to determine a high-water value of the fan control value. The high-water value is stored in a location that is accessible by a pre-runtime fan control engine of the computing device. In response to a pre-runtime event, the fan speed is initialized to a speed using the high-water value.

20 Claims, 3 Drawing Sheets

US 10,935,960 B2

PRE-RUNTIME FAN CONTROL

BACKGROUND

Computing systems and many other electrical devices use components that can generate heat during operation. Many of these components need to be cooled to prevent damage to the component or other parts of the computing system or electronic device. One or more fans can be used to move air through the electronic systems and across heat generating components to transfer the heat to ambient air.

BRIEF DESCRIPTION OF THE DRAWINGS

The following detailed description references the drawings, wherein.

Figure 2:
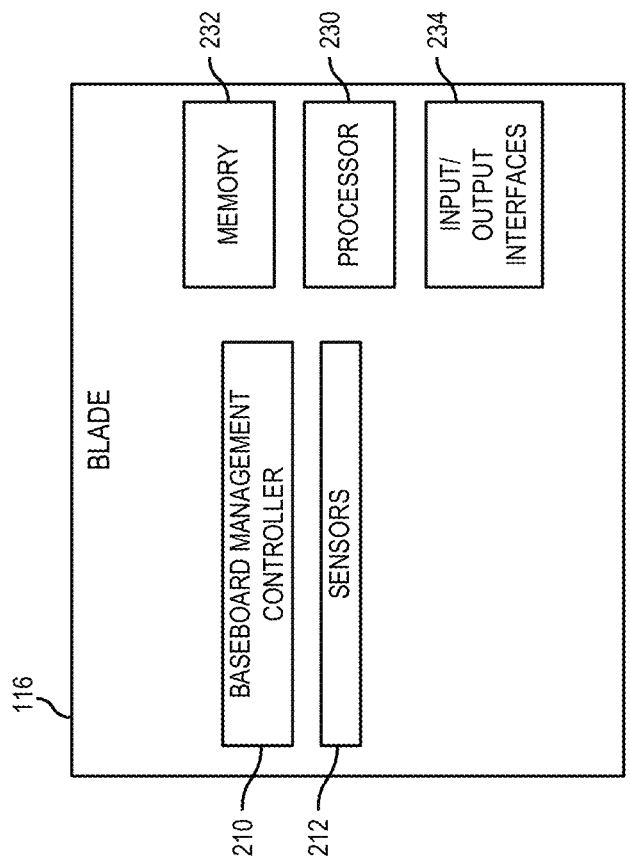
FIG. 2 is a block diagram of a blade including a baseboard management controller and sensors, according to an example.

Throughout the drawings, identical reference numbers may designate similar, but not necessarily identical, elements. An index number "N" appended to some of the reference numerals may be understood to merely denote plurality and may not necessarily represent the same quantity for each reference numeral having such an index number "N". Additionally, use herein of a reference numeral without an index number, where such reference numeral is referred to elsewhere with an index number, may be a general reference to the corresponding plural elements, collectively or individually. In another example, an index number of "I," "M," etc. can be used in place of index number N.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

Thermal management of Information Technology (IT) and Operational Technology (OT) products is useful to the overall health of a product. Many products include one or more fans and rely on one or more thermal sensor readings to decide what speed to run the fans at. In enclosures with a large number of sensors and a large number of fans, the complexity in determining the right speed to run each fan can become challenging to manage. Examples of ways to manage these fans and other cooling devices include thermal tables and neural networks for controlling fan speeds. Due to these complexities, a thermal management controller may need to boot up and have other components boot up to be able to relay information to the thermal management controller prior to having information that would be used for managing the fans. The traditional way to control fans prior to the thermal management controller booting up is to set each of the fans to a preset value, such as a maximum fan speed. This can protect the internal components prior to the fine tuning of the thermal management controller. However, it can create a large amount of noise.

An emerging class of server compute devices are being designed for deployment "on the edge". These products are differentiated from traditional datacenter compute because they live outside the relatively constrained environment of a datacenter. An edge server might end up being deployed on a folding table under a canopy next to a mobile missile station or in the back seat of a vehicle test mule that is undergoing development and testing. These edge servers are often located near humans and for that reason there are new considerations on keeping the noise levels low enough so as to avoid injury and annoyance.

As noted, one common server characteristic is that when the system is initializing, because the thermal conditions are unknown, the thermal management controller will spin all fan speeds up to the maximum speed. Fans at this speed can reach noise levels in excess of 87 dB for up to several minutes, greatly annoying users and leading to customer support calls and complaints.

Accordingly, approaches disclosed herein set safe fan speeds without waiting for full initialization of the thermal monitoring system, thus eliminating times where the fans unnecessarily run at maximum speed.

During operation of the system, a runtime fan control system monitors thermal conditions from an array of sensors and sets fan speeds accordingly. Approaches disclosed herein track the highest fan speed used to maintain temperatures that are safe for the operation of the hardware. This speed is recorded as a high-water value for the fan speed. Any time a new high-water value is obtained, the approach saves this fan speed value to a special piece of non-volatile memory that can be accessed even when the operating system hosting the runtime fan control is unavailable.

During particular events, such as disruptive operations such as a system reboot, system startup, or firmware update, the described approaches replaces the approach used for thermal management with using a fan speed associated with the high-water value. Depending on the system hardware architecture, various examples can be implemented via a fan control chip (e.g., a PIC), a pulse width modulation (PWM) controller, programmable logic device (PLD), or during bootloader initialization. This type of fan control can be considered "pre-runtime fan control". The pre-runtime fan control can set the fans to a recently safe speed within zero to five seconds of the causing event (e.g., system power-on). The pre-runtime fan controller reads the last known high-water number for the accessible non-volatile storage and programs that into each fan board. Once the management system is fully enabled, runtime fan management based on sensor data and thermal tables can resume.

In some examples, the fan boards may use a watchdog timer to ensure that it is getting a valid update of thermal management information. During the pre-runtime event, the fan board watchdog timer may be disabled. When the management system is fully enabled, the watchdog timer can be re-enabled.

In some examples, to prevent the high-water number from eventually converging to 100% (maximum fan speed) over long periods of usage, approaches can be used to reset the high-water number based on criteria or events. In one example, the system monitors an inlet temperature that was present when the high-water fan speed was captured. If the inlet temperature goes down significantly from previous high-water values, the old high-water number can be discarded and replaced with a new one that is tied to the current observed inlet temperature.

An example of this would be if a customer was using the computing device out in a desert next to a mobile missile station with inlet temperatures in excess of 120 degree Fahrenheit, the computing device may end up with a high-water fan speed of 80% of the max speed. Later when the computing device is relocated into an office environment to further analyze the data, the inlet temperature might only be 75 degrees Fahrenheit so it is completely reasonable to set a new high-water fan speed to match the operating fan speed, for example in the order of 30% of the max speed.

In certain examples, the approaches described herein can also observe the installed contents of the enclosure to determine whether to readjust the high-water value. For example, if a compute blade of a blade chassis is removed from the enclosure, it can trigger removal of old high-water values and set the state to match a new thermal state required for the smaller number of compute resources. Again, these examples can prevent the high-water value from converging on 100% and not going down even though it is perfectly safe to go down when blades are later removed.

The approaches can provide beneficial noise results. Whereas a traditional datacenter product will provide noise levels that are at the least annoying and sometimes unsafe for minutes at a time, approaches described herein ensure that the customer can use the computing device without creating a noisy environment for coworkers or suffering hearing loss due to loud sounds.

Figure 1:
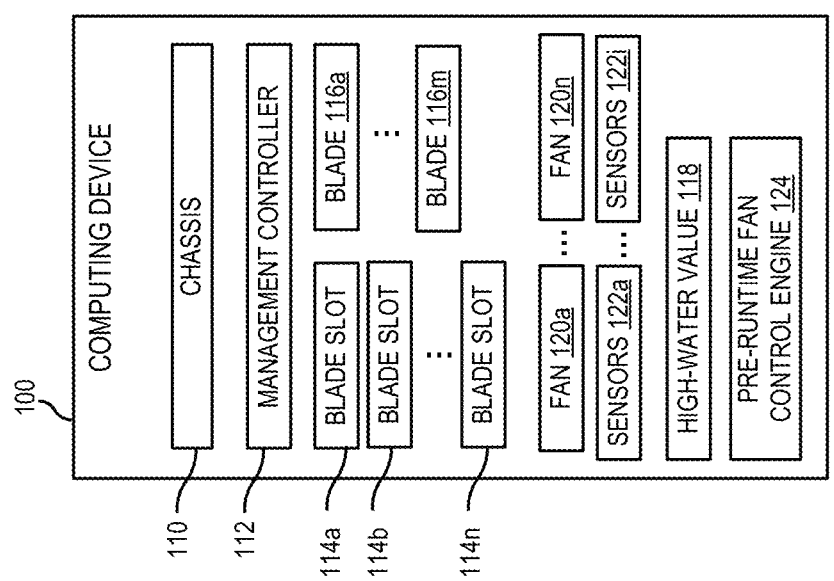
FIG. 1 is a block diagram of a computing device including a chassis management controller that is capable of controlling a fan, according to an example.

FIG. 1 is a block diagram of a computing device including a chassis management controller that is capable of controlling a fan, according to an example. Computing device 100 includes components that can be utilized to control fans. The computing device may be a computer such as a blade server. The computing device 100 can include a chassis 110 with a management controller (MC) 112. The computing device 100 can also include a number of blade slots 114a, 114b-114n. One or more blades 116a-116m can be coupled to one or more blade slots 114. The computing device 100 can also have one or multiple fans 120a-120n. Similarly, the computing device 100 can include sensors 122a-122i.

As used herein, a "blade" 116 may be a physical computing device that comprises memory and at least one logical processor, and that is mountable to a chassis or blade enclosure. In some examples, a blade 116 may be a modular computing device that is physically mountable to a blade or chassis for operation, that includes certain core computing resources (e.g., logical processor(s) and memory), and that excludes certain peripheral computing resource(s) (e.g., a power supply, cooling fan(s), external networking ports, and the like, or a combination thereof).

As used herein, a "blade enclosure" may be a chassis 110 to receive a plurality of blade devices and provide at least one peripheral resource for the received blade devices. For example, a blade enclosure may include fan(s) 120 to cool mounted blade devices, at least one power supply to provide power to mounted blade devices, external network ports for mounted blade devices, and the like, or a combination thereof. A chassis 110 is a frame or other supporting structure on which circuit boards or other electronics can be mounted.

In one example, a blade 116 may be a compute blade configured to provide processing and memory. In another example, the blade 116 can be a memory blade used as an expansion to provide additional memory to other blades 116. In some examples, the blade 116 can be an appliance to perform a special purpose. For example, the blade 116 may be an input/output or networking blade with multiple ports available. Different configurations of blades can lead to different nodes in a neural network being used and implemented.

A management controller 112 can be included on a circuit board attached to the chassis 110 (e.g., a blade enclosure). The MC 112 is separate from a blade 116. Further, circuitry can be implemented to connect a communication interface between the MC 112 to one or more of the blades 116 via blade slots 114.

In some examples, the MC 112 can be used to implement services for the computing device 100. MC 112 can be implemented using a separate processor from the processing element that is used to execute a high level operating system within the blades and a baseboard management controller supported in each blade. MC 112 can provide so-called "lights-out" functionality for the computing device 100. The lights out functionality may allow a user, such as a systems administrator, to perform management operations on the computing device 100 even if an operating system is not installed or not functional on the computing device 100. Moreover, in one example, the MC 112 can run on auxiliary power, thus the computing device 100 need not be powered on to an on state where control of the computing device 100 is handed over to an operating system after boot. As examples, the MC 112 may provide so-called "out-of-band" services, such as remote console access, remote reboot and power management functionality, monitoring health of the system, access to system logs, and the like for the chassis and/or each separate blade.

The MC 112 can be implemented using a processing element. In some examples, a processing element may be, one or multiple central processing unit (CPU), one or multiple semiconductor-based microprocessor, one or multiple graphics processing unit (GPU), other hardware devices suitable for retrieval and execution of instructions stored in a machine-readable storage medium, or combinations thereof. The processing element can be a physical device. Moreover, in some examples, the processing element may include multiple cores on a chip, include multiple cores across multiple chips, multiple cores across multiple devices, or combinations thereof. A processing element may fetch, decode, and execute instructions to implement tasks. As an alternative or in addition to retrieving and executing instructions, processing element may include at least one integrated circuit (IC), other control logic, other electronic circuits, or combinations thereof that include a number of electronic components for performing the functionality described herein.

In some examples, sensors 122 associated with the computing device can be connected directly or indirectly to the MC 112 and can measure internal physical variables such as humidity, temperature, pressure, power supply voltage, communications parameters, fan speeds, operating system functions, or the like. The MC 112 may also be capable to reboot or power cycle the one or more of the blades 116. As noted, the MC 112 allows for remote management of the device, as such, notifications can be made to a centralized station using the MC 112 and passwords or other user entry can be implemented via the MC 112.

In one example, the MC 112 is a chassis management controller (CMC) for a blade device. In this examples one or more of the sensors being read can be on a blade 116 coupled to the chassis 110.

In some examples, the MC 112 can connect to a management platform that is external to the computing device 100 via a management network. Moreover, in some examples, the MC 112 can be used to control the fans 120 and be coupled to sensors 122 and blades 116 via blade slots 114. In some examples, one blade may use multiple blade slots. In other examples, one blade 116 may use a single blade slot 114. As used herein, a blade slot 114 is a portion of an enclosure that has electrical components to attach electronics disposed on the chassis 110 to a blade.

The MC 112 may boot when power is applied to the chassis 110 (e.g., via a power supply unit). As noted, the MC 112 may be powered on an auxiliary power rail compared to a central processing unit (e.g., a CPU located on a blade 116). The MC 112 can boot to its operating system. The operating system can be a type of open source such as LINUX, a proprietary OS, or the like. A boot loader such as a Universal Boot Loader (U-Boot) can be used to boot the OS. Other proprietary boot loaders can also be used. Further, security such as a hardware root of trust, chaining of certificates or attestation of software can be used while booting the MC 112. As noted, this can take some time. During this period of time, or at another pre-runtime event, a high-water value can be used for fan control.

As used herein, a "pre-runtime event" is an event that can occur that would cause a "fan control module" responsible for fan control to be disabled or not working. Examples of a pre-runtime event include a reset of the MC 112, a power cycle of the computing device 100, and a firmware update. As used herein, a "fan control module" is a control module that is responsible for receiving multiple inputs (e.g., sensor inputs) and determining control of one or more fans for thermal management based on the inputs. For the purposes herein, a pre-runtime fan control engine 124 can be responsible for fan control until the fan control module is implemented. This can occur during the boot loading process (e.g., via U-Boot) or after the boot loading process.

The MC 112 can be used to implement a fan table or neural network that includes multiple nodes. A neural network is an information processing paradigm that includes a number of interconnected processing elements working in unison to solve a specific problem. In this example, the problem can be considered to choose a fan speed for a fan or set of fans. The neural network includes nodes. The nodes can have inputs. The inputs can come from sensors 122, other devices, such as a baseboard management controller 210 from a blade 116, etc.

The MC 112 can know where the inputs are based on a location file. The location file define a location for the MC 112 to be able to contact each sensor/input and how to interact with that sensor/input to receive information. Examples of sensors 122 include stand-alone chassis sensors, sensors on various components such as a complex programmable logic device (CPLD) sensor, power supply sensors, sensors at various blades 116 in the system, etc.

In one example, a first blade 116 includes potential inputs (e.g., sensors, BMC, etc.). In another example, a second blade 116 can include other potential inputs. As noted above, the sensors and other inputs can be defined in a location file. The location file can include information needed to access the sensors (e.g., temperature, pressure, current, power, voltage, etc. sensors). In some examples, the location file can be implemented as a human-readable text to transmit object information, for example as a JAVASCRIPT Object Notation (JSON) file, a text file, etc. In some examples, the location file can be considered a sensor description record (SDR).

A node description file can be used to describe the nodes of the neural network and the interconnections. The node description file can also be a human-readable text file. In some examples, the grid can be defined node by node. Nodes can be defined by their inputs, their weights for their inputs, various operations performed on data, etc. The nodes can also support optional debug reports to help facilitate grid development.

For each node, a specified weighting to each input can be applied. The weighting can be any percentage number from 0 through +∞ and even negative numbers. A weighting of 100 is 100% in this example.

In one example, thermal properties (e.g., temperatures) are received through sensors for the node. These sensors may have something in common, for example, a location associated with a cooling zone. In one example, a weighting can be used to ensure that each temperature sensor reading is at a same level as the others (e.g., a numeric value would represent the same thing). A function can be run on the weighted inputs. One example could be an average function such as a mean, median function. Another example function is a minimum function. Another example could be a max function, which could be of interest because this could be an area in need of cooling.

In one example, one or more sensors can have values and a function can be used to calculate a fan speed to set one or more fans to be based on sensor information from one or more of the sensors. In one example, a fan table can be used to map a fan speed value for a fan 120 to values for one or more inputs (e.g., sensor inputs). In another example, another data structure, regular expression, or function can be used to convert the sensor inputs into a fan speed, for example, based on thermal equations.

While fan control is being implemented, a fan control module implemented by the MC 112 can receive sensor data from multiple sensors 122 of the computing device 100. As noted above, sensors 122 associated with the computing device can be connected directly or indirectly to the MC 112 and can measure internal physical variables such as humidity, temperature, pressure, power supply voltage, communications parameters, fan speeds, operating system functions, or the like. Indirect connections can be via one or more bus, interconnecting chips, multiplexors, bridges, combinations thereof, etc. Further, data received from processors can be preprocessed by another ASIC.

The MC 112 can control a fan speed of one or more fan 120 based on the sensor data. The MC 112 can determine a fan control value for the fan based on the sensor data. In the neural network example above, the fan control value can be an output value from a neural network node to control the fan. In the fan table example, the fan control value can be looked up based on a table, where one or more of the inputs are used to look up which value on the table should be used. In another example, a function with the sensor data as one or more inputs can be used to determine the fan control value. Multiple fans can be controlled in this manner. In some examples, each may have a different fan control value. Though much of the description herein describes control of one fan, the same approach can be used to control one or more other fans in the computing device 100. The fan control value can be used to control the associated fan(s). The fan control value can be used, for example to set a register or other storage that is read to determine the speed of the fan, used as an input to control a PWM signal to control the fan, or the like. The fan control value can be an integer or other data structure and can be a representative of speed of the fan. In some examples, the fan control value can be a speed of the fan, in other fan control value can represent revolutions per minute of a fan or similar value. In this manner, the fan control value can be an abstraction representing the speed of the fan.

The fan control value for a fan 120a can be monitored. The fan control value can be monitored to determine a high-water value of the fan control value. As used herein, a "high-water value" is a highest setting of the fan speed that has been monitored unless a predetermined exception causing reset or replacement of the high-water value occurs. Accordingly, the current high-water value can be stored. When the fan control value changes, the fan control value can be compared to the high-water value. If the fan control value represents a greater speed than the current high-water value, the high-water value can be changed to (e.g., replaced) a new high-water value that corresponds to the fan control value. Previous high-water values can be kept.

The high-water value 118 can be stored in a location that is accessible by a pre-runtime fan control engine 124. In some examples, the high-water value 118 is stored in a flash storage or other media that is accessible by the pre-runtime fan control engine 124. This media can be, for example, storage on the management controller 112, a flash connected via a bus to the pre-runtime fan control engine 124, a memory associated with a PIC or PLD, or similar storage mechanism. The location of the storage can be set by the MC 112 and used by the pre-runtime fan control engine 124.

In some examples, the MC 112 may sample and store a value of sensor data associated with one or more of the sensors 122. This sampled sensor value at time of the high-water value reading can be stored in a data structure along with the high-water value. In some examples, the sensor can be a temperature sensor associated with an air inlet of the computing device 100.

Moreover, the MC 112 can sample the sensor data over a period of time. If the value of the sensor data (either an inlet sensor or another sensor) indicates that the sampled sensor data is below the sensor value at the time of the high-water value reading according to predetermined criteria, the high-water value can be set to another value (e.g., the current fan control value). In some examples, the criteria can include a predetermined period of time that the sensor value is below the sensor value at the time of high-water value reading. Further, in some examples, the criteria can also include an offset that the sensor value needs to be below the sensor value at the time of high-water value reading.

An example of this would be if a customer was using the computing device out in a desert next to a mobile missile station with inlet temperatures in excess of 120 degree Fahrenheit, the computing device may end up with a high-water fan speed of 80% of the max speed. Later when the computing device is relocated into an office environment to further analyze the data, the inlet temperature might only be 75 degrees Fahrenheit so it is completely reasonable to set a new high-water fan speed to match the operating fan speed, for example in the order of 30% of the max speed.

In another example, the high-water value can be reset based on a configuration change of the computing device 100. For example, the MC 112 can determine a presence of a blade 116 at the chassis. If there is a change (e.g., the addition or subtraction of a blade) in the presence of a blade device, the high-water value can be reset to another value (e.g., a predetermined value, the current value of the fan control, etc.).

An example of this would be that 4 blades are originally inserted when a high-water value is taken. Later, a blade is removed, which changes the thermal makeup of the computing device. Accordingly, the high-water value can be re-calculated downward.

When a pre-runtime event occurs, the pre-runtime fan control engine 124 can initialize the fan to a speed using the high-water value 118 that is stored at the storage. In one example, a pre-runtime event can be monitored by setting of a register, flag, or data structure. In some examples, the setting can be set to a particular value when the computing device is powered off or reset indicating that the pre-runtime fan control engine 124 should be used. This value can also be set (e.g., for the case of a firmware upgrade or other special event).

The pre-runtime fan control engine 124 can be implemented depending on selected system hardware architecture. Examples of a pre-runtime fan control engine 124 can include a fan control chip (e.g., a PIC), a pulse width modulation (PWM) controller, programmable logic device (PLD), another ASIC, or instructions of a software function that can execute on the MC 112 early during bootloader initialization.

In some examples, the fan circuits may use a watchdog timer to ensure that it is getting a valid update of thermal management information. During the pre-runtime event, the fan board watchdog timer may be disabled. When the fan management system is fully enabled, the watchdog timer can be re-enabled.

Further, in some examples, the pre-runtime fan control engine 124 can sample one of the sensors associated with an inlet temperature. The sampled temperature value can be compared to a temperature value taken from the same sensor when the high-water value was sampled. In one example, if the inlet temperature is within a predetermined criteria higher than the temperature value when the high-water value was sampled, the fan speed can be set to a predetermined value (e.g., a max value) instead of the high-water value. This can be useful to ensure proper thermal management for a case where the computing device is moved to another environment (e.g., movement from an office to a desert environment). The pre-runtime fan control engine 124 can include hardware and/or combinations of hardware and programming to perform functions provided herein.

In one example, the sensor (e.g., an inlet temperature sensor) can be connected directly to the pre-runtime fan control engine 124 or connected via limited number of connections. The sensor can also be connected via another route to the fan control module.

FIG. 2 is a block diagram of a blade including a baseboard management controller and sensors, according to an example. Blade 116 can include components that can be utilized to communicating sensor information to a MC 112 and to communicate information from a BMC 210. Sensor information can be gathered from various sensors 212 present on the blade 116. Some sensors may be disposed on a processor 230 or other ASICs.

In some examples, the BMC 210 can be implemented using an engine that includes hardware and/or combinations of hardware and programming to perform functions provided herein. Moreover, the modules (not shown) can include programming functions and/or combinations of programming functions to be executed by hardware as provided herein. When discussing the engines and modules, it is noted that functionality attributed to an engine can also be attributed to the corresponding module and vice versa. Moreover, functionality attributed to a particular module and/or engine may also be implemented using another module and/or engine.

A processor 230, such as a central processing unit (CPU) or a microprocessor suitable for retrieval and execution of instructions and/or electronic circuits can be configured to perform the functionality of any of executing a host operating system. In certain scenarios, instructions and/or other information such as virtual machines, production applications, etc. can be included in memory 232 or other memory. Input/output interfaces 234 may additionally be provided by the blade 116. In some examples, this can be via a communication fabric that can connect to ports on a blade enclosure. In one example, input devices, such as a keyboard, a sensor, a touch interface, a mouse, a microphone, etc. can be utilized to receive input from an environment surrounding the computing blade 116. Further, an output device, such as a display, can be utilized to present information to users. Examples of output devices include speakers, display devices, amplifiers, etc. Moreover, in certain examples, some components can be utilized to implement functionality of other components described herein. Input/output devices such as communication devices like network communication devices or wireless devices can also be considered devices capable of using the input/output interfaces 234.

In some examples, the BMC 210 can be used to implement services for the blade 116. BMC 210 can be implemented using a separate processor from the processing element or processor 230 that is used to execute a high level operating system. BMCs can provide so-called "lights-out" functionality for computing devices. The lights out functionality may allow a user, such as a systems administrator, to perform management operations on the blade 116 even if an operating system is not installed or not functional on the blade. Moreover, in one example, the BMC 210 can run on auxiliary power, thus the blade 116 need not be powered on to an on state where control of the blade 116 is handed over to an operating system after boot. As examples, the BMC 210 may provide so-called "out-of-band" services, such as remote console access, remote reboot and power management functionality, monitoring health of the system, access to system logs, and the like. As used herein, a BMC 210 has management capabilities for sub-systems of the blade 116.

As noted, in some instances, the BMC 210 may enable lights-out management of the blade 116, which provides remote management access (e.g., system console access) regardless of whether the computing device 200 is powered on, whether a primary network subsystem hardware is functioning, or whether an OS is operating or even installed. The BMC 210 may comprise an interface, such as a network interface, and/or serial interface that an administrator can use to remotely communicate with the BMC 210. As used herein, an "out-of-band" service is a service provided by the BMC 210 via a dedicated management channel (e.g., the network interface or serial interface) and is available whether the computing device 200 is in powered on state.

In some examples, a BMC 210 may be included as part of the electronics of the blade 116 and is separate from the MC 112. In examples, the BMC 210 can be connected via an interface (e.g., a peripheral interface). In some examples, sensors associated with the BMC 210 can measure internal physical variables such as humidity, temperature, power supply voltage, communications parameters, fan speeds, operating system functions, or the like. The BMC 210 may also be capable to reboot or power cycle the blade 116. As noted, the BMC 210 allows for remote management of the device, as such, notifications can be made to a centralized station using the BMC 210 and passwords or other user entry can be implemented via the BMC 210. In some examples, the BMC 210 can access health and/or metrics information about the processor. This can include, for example, the speed the clock, the voltage usage, a temperature associated with the processor, knowledge of a function call that is expected to represent a large workload, etc.

A firmware engine can be implemented using instructions executable by a processor and/or logic. In some examples, the firmware engine can be implemented as platform firmware. Platform firmware may include an interface such as a basic input/output system (BIOS) or unified extensible firmware interface (UEFI) to allow it to be interfaced with. The platform firmware can be located at an address space where the processing element (e.g., CPU) for the blade 116 boots. In some examples, the platform firmware may be responsible for a power on self-test for the blade 116. In other examples, the platform firmware can be responsible for the boot process and what, if any, operating system to load onto the blade 116. Further, the platform firmware may be capable to initialize various components of the blade 116 such as peripherals, memory devices, memory controller settings, storage controller settings, bus speeds, video card information, etc. In some examples, platform firmware can also be capable to perform various low level functionality while the blade 116 executes. Moreover, in some examples, platform firmware may be capable to communicate with a higher level operating system executing on a CPU, for example via an advanced configuration and power interface (ACPI).

In certain examples, the BMC 210 can communicate with the MC 112 via an interface such as a bus. The interface can be used to communicate sensor information from the blade to the MC 112. In other examples, another interface can be used to allow the MC 112 to directly poll one or multiple of the sensors 122 directly.

Figure 3:
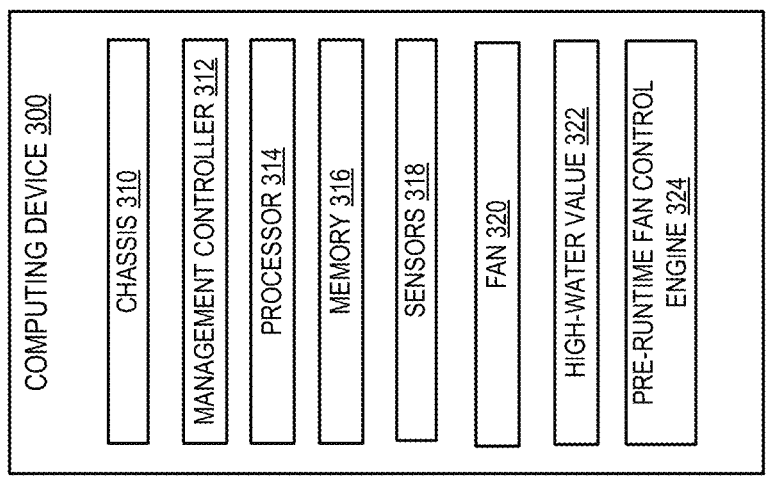
FIG. 3 is a block diagram of a computing device capable of controlling a fan during pre-runtime based on a high-water value, according to an example.

FIG. 3 is a block diagram of a computing device capable of controlling a fan during pre-runtime based on a high-water value, according to an example. The computing device 300 can be a blade enclosure with blades or another device, such as a tower computer, a server, a notebook computer, or other computing device in an enclosure that complies with the features described herein. The computing device can include a chassis 310 that includes a management controller 312, a processor 314, memory 316, sensors 318, at least one fan 320, a high-water value 322, and a pre-runtime fan control engine 324. The computing device 300 can provide functionality in a similar way that computing device 100 provides functionality and individual components can provide corresponding functionalities.

The MC 312 may boot when power is applied to the chassis 310 (e.g., via a power supply unit). The MC 312 may be powered on an auxiliary power rail compared to a central processing unit (e.g., a processor 314). The MC 312 can boot to its operating system. The operating system can be a type of open source such as LINUX, a proprietary OS, or the like. A boot loader such as a Universal Boot Loader (U-Boot) can be used to boot the OS. Other proprietary boot loaders can also be used. Further, security such as a hardware root of trust, chaining of certificates or attestation of software can be used while booting the MC 312. As noted, this can take some time. During this period of time, or at another pre-runtime event, a high-water value can be used for fan control using the pre-runtime fan control engine 324.

While fan control is being implemented, a fan control module implemented by the MC 312 can receive sensor data from multiple sensors 318 of the computing device 300. As noted above, sensors 318 associated with the computing device can be connected directly or indirectly to the MC 312 and can measure internal physical variables such as humidity, temperature, pressure, power supply voltage, communications parameters, fan speeds, operating system functions, or the like. Indirect connections can be via one or more bus, interconnecting chips, multiplexors, bridges, combinations thereof, etc. Further, data received from processors can be preprocessed by another ASIC.

The MC 312 can control a fan speed of one or more fan 320 based on the sensor data. The MC 312 can determine a fan control value for the fan based on the sensor data. In the neural network example above, the fan control value can be an output value from a neural network node to control the fan. In the fan table example, the fan control value can be looked up based on a table, where one or more of the inputs are used to look up which value on the table should be used. In another example, a function with the sensor data as one or more inputs can be used to determine the fan control value. Multiple fans can be controlled in this manner. In some examples, each may have a different fan control value. Though much of the description herein describes control of one fan, the same approach can be used to control one or more other fans in the computing device 300. The fan control value can be used to control the associated fan(s). The fan control value can be used, for example to set a register or other storage that is read to determine the speed of the fan, used as an input to control a PWM signal to control the fan, or the like. The fan control value can be an integer or other data structure and can be a representative of speed of the fan. In some examples, the fan control value can be a speed of the fan, in other fan control value can represent revolutions per minute of a fan or similar value. In this manner, the fan control value can be an abstraction representing the speed of the fan.

The fan control value for a fan 320 can be monitored. The fan control value can be monitored to determine a high-water value of the fan control value. As used herein, a "high-water value" is a highest setting of the fan speed that has been monitored unless a predetermined exception causing reset or replacement of the high-water value occurs. Accordingly, the current high-water value can be stored. When the fan control value changes, the fan control value can be compared to the high-water value. If the fan control value represents a greater speed than the current high-water value, the high-water value can be changed to (e.g., replaced) a new high-water value that corresponds to the fan control value. Previous high-water values can be kept.

The high-water value 322 can be stored in a location that is accessible by a pre-runtime fan control engine 324. In some examples, the high-water value 322 is stored in a flash storage or other media that is accessible by the pre-runtime fan control engine 324. This media can be, for example, storage on the management controller 312, a flash connected via a bus to the pre-runtime fan control engine 324, a memory associated with a PIC or PLD, or similar storage mechanism. The location of the storage can be set by the MC 312 and used by the pre-runtime fan control engine 324.

In some examples, the MC 312 may sample and store a value of sensor data associated with one or more of the sensors 318. This sampled sensor value at time of the high-water value reading can be stored in a data structure along with the high-water value. In some examples, the sensor can be a temperature sensor associated with an air inlet of the computing device 300.

Moreover, the MC 312 can sample the sensor data over a period of time. If the value of the sensor data (either an inlet sensor or another sensor) indicates that the sampled sensor data is below the sensor value at the time of the high-water value reading according to predetermined criteria, the high-water value can be set to another value (e.g., the current fan control value). In some examples, the criteria can include a predetermined period of time that the sensor value is below the sensor value at the time of high-water value reading. Further, in some examples, the criteria can also include an offset that the sensor value needs to be below the sensor value at the time of high-water value reading.

When a pre-runtime event occurs, the pre-runtime fan control engine 124 can initialize the fan to a speed using the high-water value 322 that is stored at the storage. In one example, a pre-runtime event can be monitored by setting of a register, flag, or data structure. In some examples, the setting can be set to a particular value when the computing device is powered off or reset indicating that the pre-runtime fan control engine 324 should be used. This value can also be set (e.g., for the case of a firmware upgrade or other special event).

The pre-runtime fan control engine 324 can be implemented depending on selected system hardware architecture. Examples of a pre-runtime fan control engine 324 can include a fan control chip (e.g., a PIC), a pulse width modulation (PWM) controller, programmable logic device (PLD), another ASIC, or instructions of a software function that can execute on the MC 312 early during bootloader initialization.

In some examples, the fan circuits may use a watchdog timer to ensure that it is getting a valid update of thermal management information. During the pre-runtime event, the fan board watchdog timer may be disabled. When the fan management system is fully enabled, the watchdog timer can be re-enabled.

Figure 4:
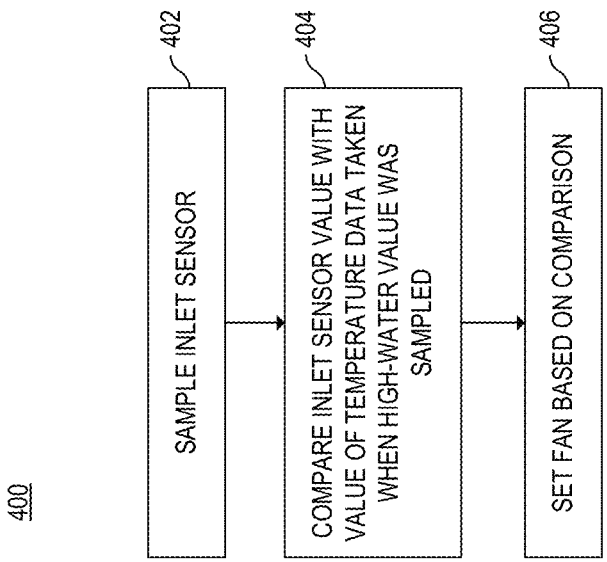
FIG. 4 is a flowchart of a method for controlling a fan during pre-runtime based on a comparison of a high-water value, according to an example.

FIG. 4 is a flowchart of a method for controlling a fan during pre-runtime based on a comparison of a high-water value, according to an example. Although execution of method 400 is described below with reference to computing device 300, other suitable components for execution of method 400 can be utilized (e.g., computing device 100). Method 400 may be implemented in the form of executable instructions stored on a machine-readable storage medium, such as storage medium, and/or in the form of electronic circuitry.

At 402, the pre-runtime fan control engine 324 can sample one of the sensors associated with an inlet temperature. The sampled temperature value can be compared to a temperature value taken from the same sensor when the high-water value was sampled.

At 404, the pre-runtime fan control engine 324 can compare the inlet sensor value of temperature data taken when the high-water value was sampled with the sampled temperature value of the same inlet sensor. The comparison can be a direct comparison or based on predetermined criteria. For example, if CURRENT INLET VALUE>HIGH-WATER INLET VALUE+PREDETERMINED OFFSET, then criteria is met.

At 406, the pre-runtime fan control engine 324 can set the fan based on the comparison. In one example, if the inlet temperature is within a predetermined criteria higher than the temperature value when the high-water value was sampled, the fan speed can be set to a predetermined value (e.g., a max value) instead of the high-water value. This can be useful to ensure proper thermal management for a case where the computing device is moved to another environment (e.g., movement from an office to a desert environment). The pre-runtime fan control engine 324 can include hardware and/or combinations of hardware and programming to perform functions provided herein.

In one example, the sensor (e.g., an inlet temperature sensor) can be connected directly to the pre-runtime fan control engine 324 or connected via limited number of connections. The sensor can also be connected via another route to the fan control module. With this type of connection, the pre-runtime fan control engine 324 can make decisions based on potentially great changes in environment (based on inlet temperature) prior to full booting of the fan control module.

Figure 5:
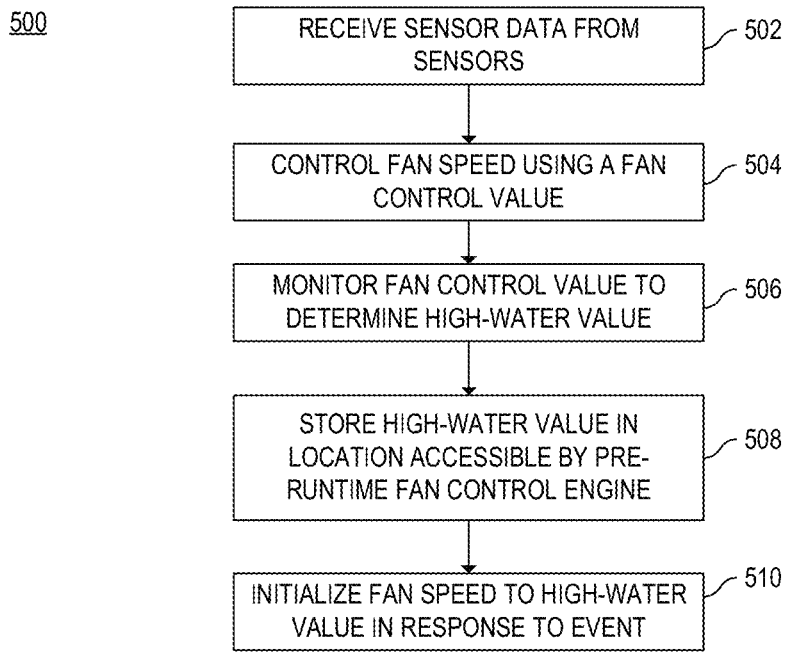
FIG. 5 is a flowchart of a method for initializing fan speed to a high-water value in response to an event, according to an example.
Figure 6:
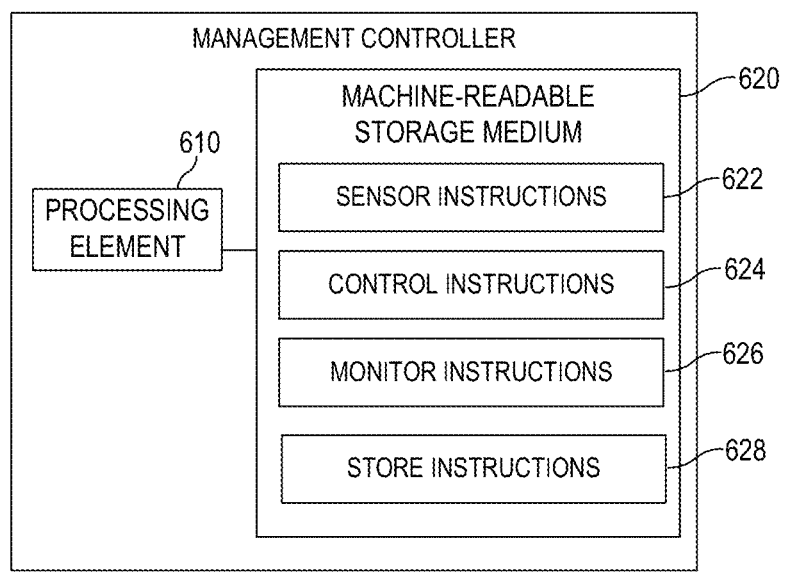
FIG. 6 is a block diagram of a management controller capable of determining a high-water value for use pre-runtime, according to an example.

FIG. 5 is a flowchart of a method for initializing fan speed to a high-water value in response to an event, according to an example. FIG. 6 is a block diagram of a management controller capable of determining a high-water value for use pre-runtime, according to an example.

The MC 600 includes, for example, a processing element 610, and a machine-readable storage medium 620 including instructions 622, 624, 626, 628 for setting a high-water value that can be used in response to an event to control fans in a computing system that the MC 600 is in. The MC 600 can be included in a computing device, for example, a notebook computer, a server, an edge device, a tower, or any other computing device capable of providing the functionality described herein. The MC 600 can run on an auxiliary power rail of the computing device.

Processing element 610 may be, one or multiple central processing unit (CPU), one or multiple semiconductor-based microprocessor, one or multiple graphics processing unit (GPU), other hardware devices suitable for retrieval and execution of instructions stored in machine-readable storage medium 620, or combinations thereof. The processing element 610 can be a physical device. Moreover, in one example, the processing element 610 may include multiple cores on a chip, include multiple cores across multiple chips, or combinations thereof. Processing element 610 may fetch, decode, and execute instructions 622, 624, 626, 628 to implement portions of method 500. As an alternative or in addition to retrieving and executing instructions, processing element 610 may include at least one integrated circuit (IC), other control logic, other electronic circuits, or combinations thereof that include a number of electronic components for performing the functionality of instructions 622, 624, 626, 628.

Machine-readable storage medium 620 may be any electronic, magnetic, optical, or other physical storage device that contains or stores executable instructions. Thus, machine-readable storage medium may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium can be non-transitory. As described in detail herein, machine-readable storage medium 620 may be encoded with a series of executable instructions for storing a high-water value in a location accessible by a pre-runtime fan control engine.

While fan control is being implemented by the MC 600, a fan control module implemented can receive sensor data from multiple sensors of the computing device (502). Sensor instructions 622 can be executed by processing element 610 to receive and process the sensor data. As noted above, sensors associated with the computing device can be connected directly or indirectly to the MC 600 and can measure internal or external physical variables such as humidity, temperature, pressure, power supply voltage, communications parameters, fan speeds, operating system functions, or the like. Indirect connections can be via one or more bus, interconnecting chips, multiplexors, bridges, combinations thereof, etc. Further, data received from processors can be preprocessed by another ASIC.

The processing element 610 can control a fan speed of one or more fan based on the sensor data by executing control instructions 624 (504). The MC 600 can determine a fan control value for the fan based on the sensor data. In the neural network example above, the fan control value can be an output value from a neural network node to control the fan. In the fan table example, the fan control value can be looked up based on a table, where one or more of the inputs are used to look up which value on the table should be used. In another example, a function with the sensor data as one or more inputs can be used to determine the fan control value. Multiple fans can be controlled in this manner. In some examples, each may have a different fan control value.

At 506, monitor instructions 626 can be executed to monitor the fan control value to determine a high-water value. The current high-water value can be stored. When the fan control value changes, the fan control value can be compared to the high-water value. If the fan control value represents a greater speed than the current high-water value, the high-water value can be changed to (e.g., replaced, set, etc.) a new high-water value that corresponds to the fan control value. Previous high-water values can be kept.

The high-water value can be stored in a location that is accessible by a pre-runtime fan control engine (508) by executing store instructions 628. In some examples, the high-water value is stored in a flash storage or other media that is accessible by the pre-runtime fan control engine. This media can be, for example, storage on the management controller 600, a flash connected via a bus to the pre-runtime fan control engine, a memory associated with a PIC or PLD, or similar storage mechanism. The location of the storage can be set by the MC 600 and used by the pre-runtime fan control engine.

In some examples, the MC 600 may sample and store a value of sensor data associated with one or more of the sensors. This sampled sensor value at time of the high-water value reading can be stored in a data structure along with the high-water value. In some examples, the sensor can be a temperature sensor associated with an air inlet of the computing device.

Moreover, the MC 600 can sample the sensor data over a period of time. If the value of the sensor data (either an inlet sensor or another sensor) indicates that the sampled sensor data is below the sensor value at the time of the high-water value reading according to predetermined criteria, the high-water value can be set to another value (e.g., the current fan control value). In some examples, the criteria can include a predetermined period of time that the sensor value is below the sensor value at the time of high-water value reading. Further, in some examples, the criteria can also include an offset that the sensor value needs to be below the sensor value at the time of high-water value reading.

When a pre-runtime event occurs, the pre-runtime fan control engine can initialize the fan to a speed using the high-water value that is stored at the storage. In one example, a pre-runtime event can be monitored by setting of a register, flag, or data structure. In some examples, the setting can be set to a particular value when the computing device is powered off or reset indicating that the pre-runtime fan control engine should be used. This value can also be set (e.g., for the case of a firmware upgrade or other special event).

The pre-runtime fan control engine 324 can be implemented depending on selected system hardware architecture. Examples of a pre-runtime fan control engine 324 can include a fan control chip (e.g., a PIC), a pulse width modulation (PWM) controller, programmable logic device (PLD), another ASIC, or instructions of a software function that can execute on the MC 312 early during bootloader initialization. Pre-runtime can end when control of the fans is turned over to a fan control module that uses multiple sensors and a more complex strategy.

While certain implementations have been shown and described above, various changes in form and details may be made. For example, some features that have been described in relation to one implementation and/or process can be related to other implementations. In other words, processes, features, components, and/or properties described in relation to one implementation can be useful in other implementations. Furthermore, it should be appreciated that the systems and methods described herein can include various combinations and/or sub-combinations of the components and/or features of the different implementations described. Thus, features described with reference to one or more implementations can be combined with other implementations described herein.

The invention claimed is:

1. A computing device comprising:
a chassis including at least one fan;
a management controller (MC) including a processing element and a non-transitory machine readable media comprising instructions that, when executed by the processing element cause the MC to:
receive a plurality of sensor data from a plurality of sensors of the computing device;
control a fan speed of one of the at least one fan using a fan control value based on the sensor data;
monitor the fan control value to determine a high-water value of the fan control value;
store the high-water value in a location accessible by a pre-runtime fan control engine; and
the pre-runtime fan control engine to, in response to a pre-runtime event, initialize the fan to a speed using the high-water value.

2. The computing device of claim 1, wherein the instructions are further executed to cause the MC to sample and store a first value of the sensor data when the high-water value is set.

3. The computing device of claim 2, wherein the instructions are further executed to cause the MC to sample the sensor data over a period of time and, if the value of the sensor data indicates that the sampled sensor data over the period of time is below the first value by predetermined criteria, set the high-water value to another value.

4. The computing device of claim 3, wherein the other value is a current value of the fan control value.

5. The computing device of claim 1, wherein the instructions are further executed to cause the MC to determine a presence of a blade device at the chassis; and in response to a change in the presence of the blade device, set the high-water value with another value.

6. The computing device of claim 1, wherein the MC is a chassis management controller (CMC) and at least one sensor of the plurality of sensors is from a blade device coupled to the chassis.

7. The computing device of claim 1, wherein the MC is separate from a host processor used to execute instructions for a high-level operating system executing on the computing device and wherein the MC provides an out of band service for the computing device.

8. The computing device of claim 1, wherein the pre-runtime event is at least one of: a reset of the MC, a power cycle of the computing device, and a firmware update.

9. The computing device of claim 1, wherein the pre-runtime fan control engine includes at least one of: a programmable logic device and a microcontroller using pulse width modulation.

10. The computing device of claim 1, wherein the pre-runtime fan control engine is implemented by the MC as part of a bootloader initialization.

11. The computing device of claim 1, wherein the pre-runtime fan control engine is further to: sample one of the sensors associated with an inlet temperature; compare the sample with a temperature of the one sensor taken when the high-water value was sampled; and if the inlet temperature is within a predetermined criteria higher than the temperature when the high-water value was sampled, set the speed of the fan to a max value instead of the high-water value.

12. A method comprising:
receiving, by a management controller (MC), a plurality of sensor data from a plurality of sensors of a computing device that includes a chassis with at least one fan;
controlling a fan speed of one of the at least one fan using a fan control value based on the sensor data;
monitoring the fan control value to determine a high-water value of the fan control value;
storing the high-water value in a location accessible by a pre-runtime fan control engine of the computing device; and
in response to a pre-runtime event, initializing the fan speed to a speed using the high-water value by the pre-runtime fan control engine.

13. The method of claim 12, further comprising:
sampling, by the MC, a first value of the sensor data when the high-water value is set;
sampling the sensor data over a period of time; and,
in response to the value of the sensor data indicating that the sampled sensor data over the period of time is below the first value by a predetermined criteria, resetting the high-water value to another value.

14. The method of claim 13, wherein the other value is a current value of the fan control value.

15. The method of claim 12, wherein the pre-runtime event is at least one of: a reset of the MC, a power cycle of the computing device, and a firmware update, and wherein the pre-runtime fan control engine includes at least one of: a programmable logic device and a microcontroller using pulse width modulation.

16. The method of claim 12, further comprising:
sampling one of the sensors associated with an inlet temperature;
comparing the sample with a temperature of the one sensor taken when the high-water value was sampled, and in response to the inlet temperature being within a predetermined criteria higher than the temperature when the high-water value was sampled, setting the speed of the fan to a max value instead of the high-water value.

17. The method of claim 12, wherein the MC is a chassis management controller (CMC) and at least one sensor of the plurality of sensors is from a blade device coupled to the chassis.

18. A non-transitory machine-readable storage medium storing instructions that, if executed by a physical processing element of a management controller (MC) of a computing device, cause the MC to:

receive a plurality of sensor data from a plurality of sensors of the computing device that includes a chassis with a fan;

control a fan speed of one of the fan using a fan control value based on the sensor data;

monitor the fan control value to determine a high-water value of the fan control value; and store the high-water value in a location accessible by a pre-runtime fan control engine of the computing device, wherein the fan speed is to be initialized by the pre-runtime fan control engine using the high-water value in response to a pre-runtime event.

19. The non-transitory machine-readable storage medium of claim 18, further comprising instructions that, if executed by the physical processing element, cause the MC to:

sample a first value of the sensor data when the high-water value is set;

sample the sensor data over a period of time; and, in response to a current value of the sensor data indicating that the sampled sensor data over the period of time is below the first value by a predetermined criteria, reset the high-water value to another value.

20. The non-transitory machine-readable storage medium of claim 18, wherein the MC is a chassis management controller (CMC) and at least one sensor of the plurality of sensors is from a blade device coupled to the chassis.

\* \* \* \* \*